US009712195B2

(12) United States Patent
Wang et al.

(10) Patent No.: US 9,712,195 B2
(45) Date of Patent: Jul. 18, 2017

(54) RADIO FREQUENCY LOW NOISE AMPLIFIER WITH ON-CHIP MATCHING AND BUILT-IN TUNABLE FILTER

(71) Applicant: QUALCOMM Incorporated, San Diego, CA (US)

(72) Inventors: Cheng-Han Wang, San Jose, CA (US); Conor Donovan, Oakland, CA (US); Jesse Aaron Richmond, Oakland, CA (US); Jin-Su Ko, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/711,623

(22) Filed: May 13, 2015

(65) Prior Publication Data

US 2016/0336983 A1 Nov. 17, 2016

(51) Int. Cl.
| | |
|---|---|
| *H04B 1/40* | (2015.01) |
| *H04B 1/10* | (2006.01) |
| *H03F 3/19* | (2006.01) |
| *H03F 3/21* | (2006.01) |
| *H04B 1/3827* | (2015.01) |
| *H04B 1/48* | (2006.01) |
| *H03F 1/56* | (2006.01) |
| *H03F 1/22* | (2006.01) |
| *H03F 1/34* | (2006.01) |

(Continued)

(52) U.S. Cl.
CPC ........... *H04B 1/1027* (2013.01); *H03F 1/223* (2013.01); *H03F 1/347* (2013.01); *H03F 1/565* (2013.01); *H03F 3/19* (2013.01); *H03F 3/193* (2013.01); *H03F 3/211* (2013.01); *H03F 3/245* (2013.01); *H04B 1/3827* (2013.01); *H04B 1/48* (2013.01); *H03F 2200/111* (2013.01); *H03F 2200/294* (2013.01); *H03F 2200/451* (2013.01); *H03F 2200/489* (2013.01); *H04B 2001/1072* (2013.01); *H04B 2001/485* (2013.01)

(58) Field of Classification Search
CPC ......... H03F 2200/294; H03F 2200/451; H03F 3/19; H03F 1/565; H03F 2200/06; H03F 2200/372; H03F 3/195; H03F 3/245; H03F 3/26; H03F 1/223; H03F 1/56; H03F 2200/318; H03F 2200/336; H03F 2200/423
USPC .......................................................... 455/77
See application file for complete search history.

(56) References Cited

U.S. PATENT DOCUMENTS

| | | |
|---|---|---|
| 6,407,640 B1 | 6/2002 | Aparin et al. |
| 8,102,213 B2 | 1/2012 | Tasic et al. |

(Continued)

OTHER PUBLICATIONS

International Search Report and Written Opinion—PCT/US2016/027949—ISA/EPO—Jul. 7, 2016.

*Primary Examiner* — Ajibola Akinyemi
(74) *Attorney, Agent, or Firm* — Paradice and Li LLP/Qualcomm

(57) ABSTRACT

An amplifier includes a gain transistor including a control terminal to receive an input signal. A degeneration inductor is coupled between the first terminal of the gain transistor and ground. A shunt inductor and a capacitor are coupled in series between the control terminal of the gain transistor and ground, and form a filter to attenuate frequencies of the input signal within a frequency range. The degeneration inductor and the shunt inductor form a transformer to provide impedance matching.

30 Claims, 14 Drawing Sheets

(51) Int. Cl.
 *H03F 3/193* (2006.01)
 *H03F 3/24* (2006.01)

(56) References Cited

U.S. PATENT DOCUMENTS

| | | | |
|---|---|---|---|
| 8,229,367 B2 * | 7/2012 | Chan | H03F 1/565 |
| | | | 327/563 |
| 8,301,101 B2 | 10/2012 | Mirzaei et al. | |
| 8,803,615 B2 | 8/2014 | Cabanillas et al. | |
| 2009/0075597 A1 * | 3/2009 | Degani | H03F 1/26 |
| | | | 455/63.1 |
| 2011/0003563 A1 * | 1/2011 | Gorbachov | H01Q 21/0025 |
| | | | 455/78 |
| 2013/0063223 A1 | 3/2013 | See et al. | |
| 2013/0203369 A1 | 8/2013 | Dogan et al. | |
| 2013/0281043 A1 | 10/2013 | Mu | |
| 2013/0316669 A1 | 11/2013 | Davierwalla et al. | |
| 2014/0134960 A1 | 5/2014 | Tasic et al. | |
| 2014/0253242 A1 | 9/2014 | Youssef et al. | |
| 2015/0035600 A1 | 2/2015 | Jin et al. | |

* cited by examiner

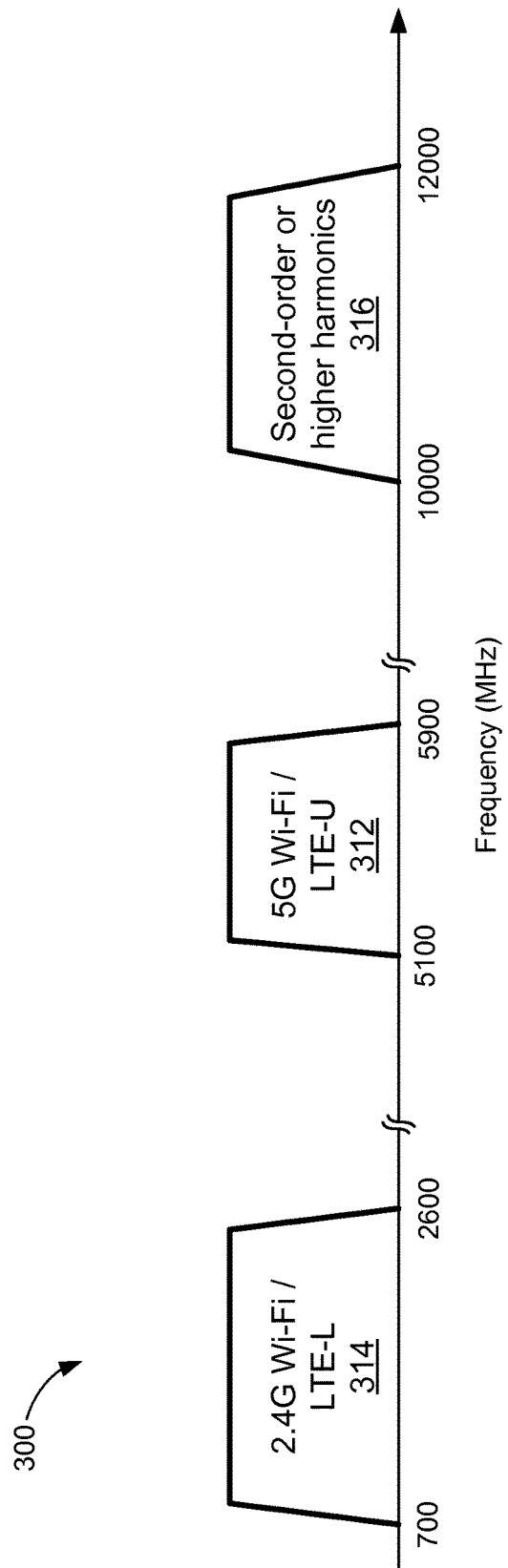

RADIO FREQUENCY LOW NOISE AMPLIFIER WITH ON-CHIP MATCHING AND BUILT-IN TUNABLE FILTER

TECHNICAL FIELD

The example embodiments relate generally to wireless communications, and specifically to amplifiers used for wireless communications.

BACKGROUND OF RELATED ART

Communication devices may transmit and receive communication data through a communication medium. In one example, the communication medium may be a wireless communication medium where communication data is transmitted and received by communication devices according to a wireless communication protocol. Example wireless communication protocols may include the IEEE 802.11 protocols (e.g., Wi-Fi), Bluetooth protocols according to the Bluetooth Special Interest Group, and Long Term Evolution (LTE). Wi-Fi communications may operate in either a frequency band centered around 2.4 GHz (e.g., 2.4G Wi-Fi communications) or a frequency band centered around 5 GHz (e.g., 5G Wi-Fi communications). LTE is a set of enhancements to the Universal Mobile Telecommunications System (UMTS) mobile standard promulgated by Third Generation Partnership Project (3GPP). LTE communications may operate in portions of the licensed frequency spectrum (e.g., between approximately 700 MHz-2.6 GHz; may be known as LTE-L) and may operate in portions of the unlicensed frequency spectrum (e.g., around 5 GHz; may be known as LTE-U).

In another example, the communication medium may be a wired communication medium where the communication data is transmitted and received according to a wire-based communication protocol. Example wire-based communication protocols may include an Ethernet® protocol and/or a Powerline Communications protocol described by the HomePlug 2.0 specification. In yet another example, the communication medium may be a hybrid combination of wired and wireless communication mediums.

Analog signals within the communication devices may undergo amplification during various processing operations. For example, an analog signal may be amplified when a communication signal is received from or transmitted to another communication device. In some cases, as an analog signal is amplified, an unwanted signal may be introduced (e.g., added) to the amplified signal. For one example, as a first signal is amplified, a second signal that is an unwanted harmonic of the first signal may also be amplified. The second signal may couple into a sensitive receive and/or transmit circuit of the communication device and interfere with the transmission and/or reception of the communication data.

For another example, when a communication device is configured for multi-band concurrent operation (e.g., to concurrently communicate with other devices using 5G Wi-Fi/LTE-U signals and using 2.4G Wi-Fi/LTE-L signals), the transmission and/or reception of signals in one frequency band may interfere with the reception of signals in the other frequency band. More specifically, the 2.4G Wi-Fi/LTE-L signals may undesirably couple into the receive circuits used for the 5G Wi-Fi/LTE-U signals, which degrades performance of the communication device.

Thus, there is a need to improve the amplification of analog signals while suppressing amplification of unwanted signals, and thereby improve the performance of the communication device.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A wireless device includes a number of transceiver chains, each including at least one amplifier. The amplifier includes at least one gain transistor including a first terminal, and including a control terminal to receive an input signal; a degeneration inductor coupled between the first terminal of the at least one gain transistor and ground; and a shunt inductor and a first capacitor coupled in series between the control terminal of the at least one gain transistor and ground, wherein the degeneration inductor and the shunt inductor form a transformer that is to provide impedance matching for the amplifier. The shunt inductor and the first capacitor form a first filter to attenuate frequencies of the input signal within a first frequency range, wherein the first frequency range is selectable by a first tuning signal.

The amplifier may also include a second capacitor coupled in parallel with the degeneration inductor, wherein the second capacitor and the degeneration inductor form a second filter to attenuate frequencies of the input signal within a second frequency range. The second frequency range is selectable by a second tuning signal. The amplifier may also include a third capacitor coupled between the control terminal and the first terminal of the at least one gain transistor, wherein the third capacitor is to select a resonant frequency of the amplifier based, at least in part, on a third tuning signal.

The wireless device may include a control circuit to generate the tuning signals. Generation of the tuning signals may be based on a frequency of the input signal and/or on a frequency of another signal. For some implementations, the input signal is associated with a first of the number of transceiver chains, and the other signal is associated with a second of the number of transceiver chains. Further, for some implementations, the input signal is a member of the group consisting of a 5G Wi-Fi signal and an LTE-U signal, and the other signal is a member of the group consisting of a 2.4G Wi-Fi signal and an LTE-L signal.

BRIEF DESCRIPTION OF THE DRAWINGS

The example embodiments are illustrated by way of example and are not intended to be limited by the figures of the accompanying drawings. Like numbers reference like elements throughout the drawings and specification.

FIG. 3 is a band diagram depicting example three frequency bands of signals that may be of interest to the example wireless device of FIG. 2.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1:
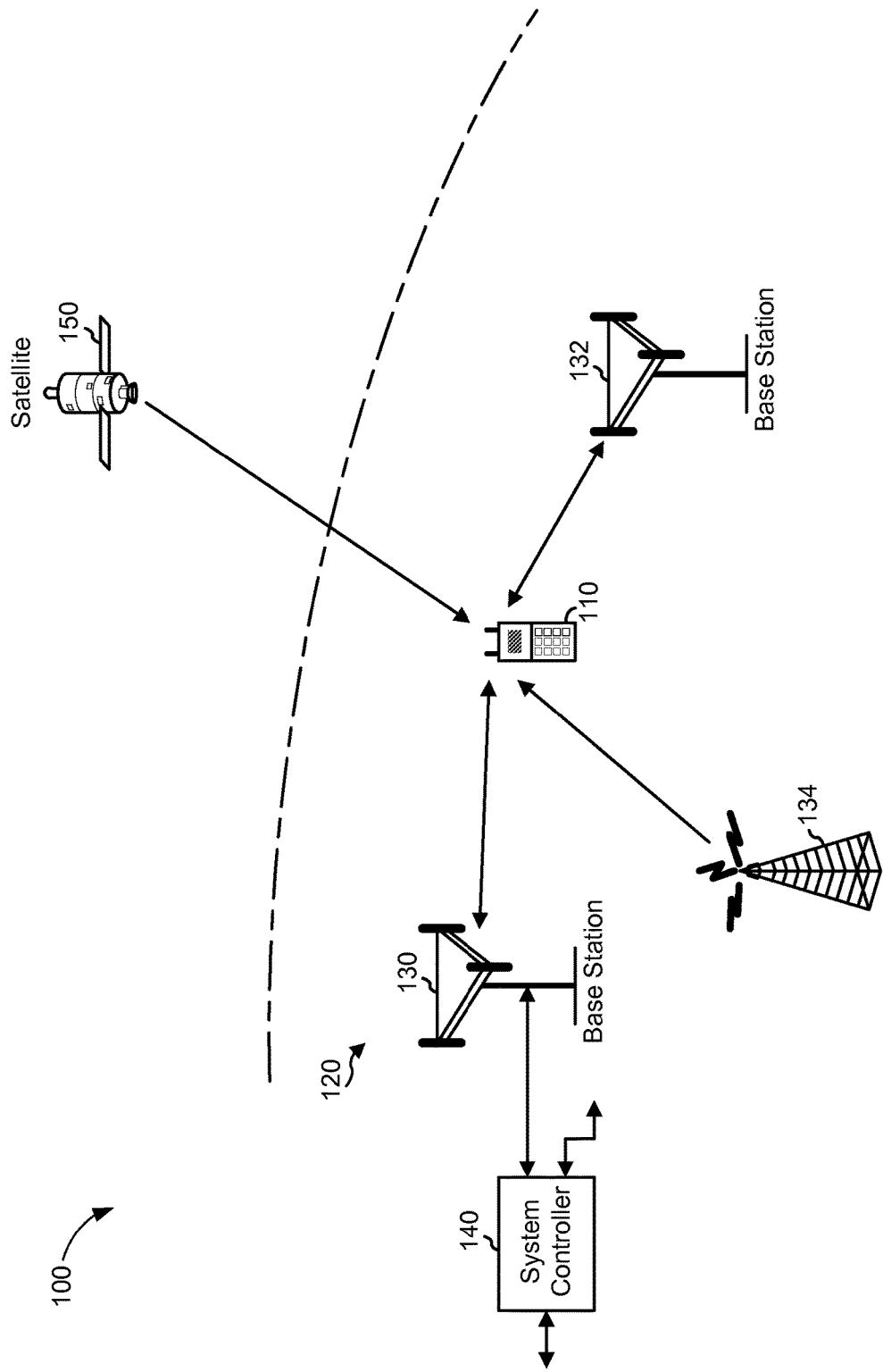
FIG. 1 is a diagram depicting a wireless device communicating with a wireless communication system, in accordance with some embodiments.

FIG. 1 is a diagram 100 depicting a wireless device 110 communicating with a wireless communication system 120, in accordance with some embodiments. The wireless communication system 120 may be an LTE system, a Code Division Multiple Access (CDMA) system, a Global System for Mobile Communications (GSM) system, a wireless local area network (WLAN) system (e.g., a Wi-Fi system), or any other suitable wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows the wireless communication system 120 including two base stations 130 and 132 and one system controller 140. In general, a wireless system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may communicate with the wireless communication system 120. The wireless device 110 may also receive signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, WCDMA, CDMA 1x, EVDO, TD-SCDMA, GSM, 802.11, etc.

Figure 2:
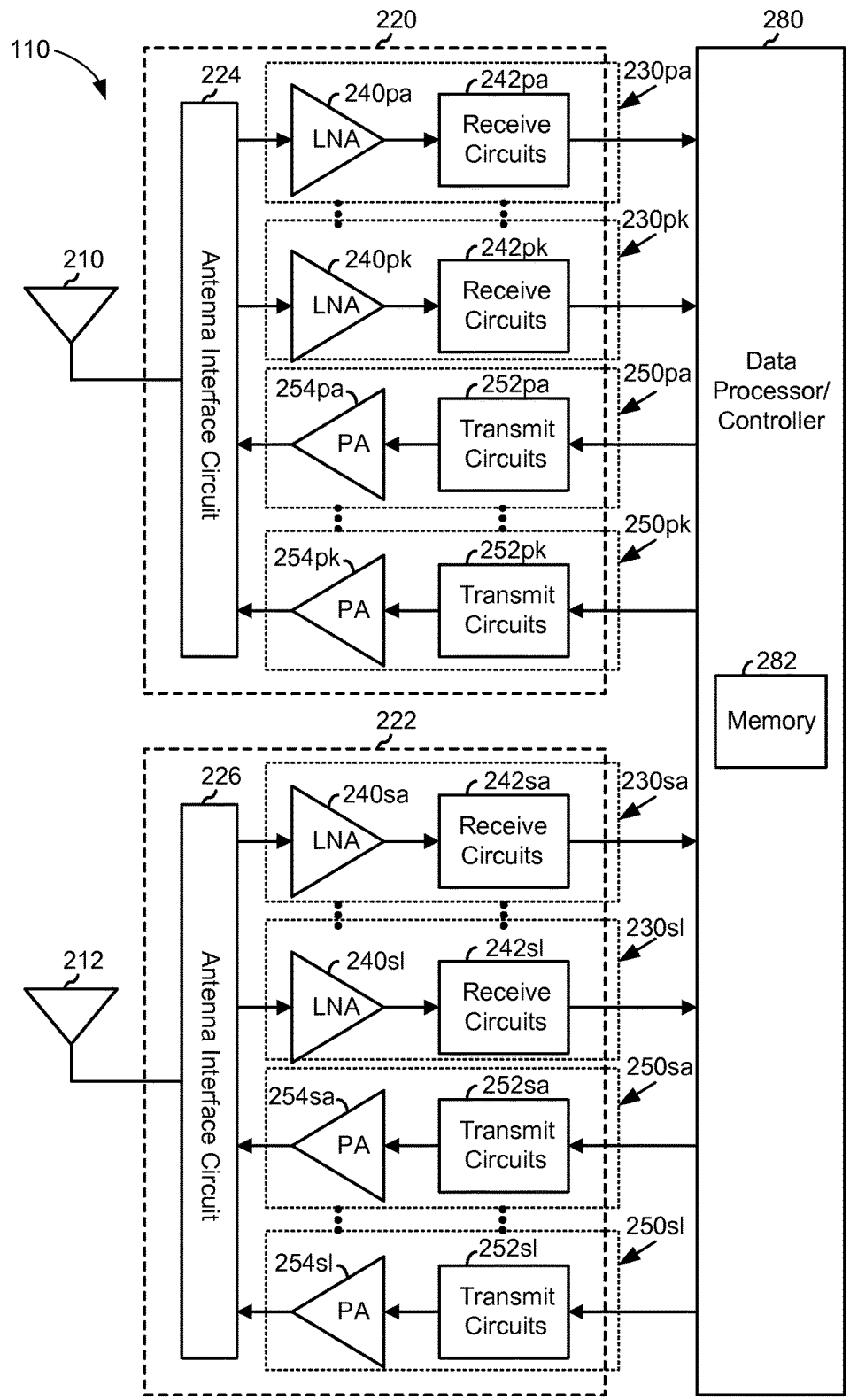
FIG. 2 is a block diagram depicting an example wireless device, in accordance with some embodiments.

FIG. 2 is a block diagram depicting an example wireless device 110, in accordance with some embodiments. For the example of FIG. 2, the wireless device 110 is shown to include a primary transceiver 220 coupled to a primary antenna 210, a secondary transceiver 222 coupled to a secondary antenna 212, and a data processor/controller 280. The primary transceiver 220 includes a number (K) of receivers 230pa to 230pk and a number (K) of transmitters 250pa to 250pk to support multiple frequency bands, multiple radio technologies, carrier aggregation, transmit diversity, and/or multiple-input multiple-output (MIMO) communications. The secondary transceiver 222 includes a number (L) of receivers 230sa to 230sl and a number (L) of transmitters 250sa to 250sl to support multiple frequency bands, multiple radio technologies, carrier aggregation, receive diversity, and/or MIMO communications.

For the example of FIG. 2, each receiver 230 (e.g., 230pa-230pk and 230sa-230sl) includes at least a low noise amplifier (LNA) 240 (e.g., 240pa-240pk and 240sa-240sl) and a receive circuit 242 (e.g., 242pa-242pk and 242sa-242sl). For data reception, the primary antenna 210 receives signals from base stations and/or other transmitter stations and provides a received radio frequency (RF) signal, which is routed through a primary antenna interface circuit 224 and presented as an input RF signal to a selected receiver. Primary antenna interface circuit 224 may include switches, duplexers, transmit filters, receive filters, matching circuits, and other suitable components or circuits. The description below assumes that the receiver 230pa is the selected receiver. Within the receiver 230pa, an LNA 240pa amplifies the input RF signal and provides an output RF signal. The receive circuit 242pa may down-convert the output RF signal from RF to baseband, amplify and filter the down-converted signal, and provide an analog input signal to data processor/controller 280. The receive circuits 242pa may include mixers, filters, amplifiers, an oscillator, a local oscillator (LO) generator, a phase locked loop (PLL), and other suitable components or circuits. Each remaining receiver 230pa to 230pk and 230sa to 230sl in the transceivers 220 and 222 may operate in similar manner as the receiver 230pa.

For the example of FIG. 2, each transmitter 250 (e.g., 250pa-250pk and 250sa-250sl) includes at least a transmit circuit 252 (e.g., 252pa-252pk and 252sa-252sl) and a power amplifier (PA) 254 (e.g., 254pa-254pk and 254sa-254sl). For data transmission, the data processor/controller 280 processes (e.g., encodes and modulates) data to be transmitted and provides an analog output signal to a selected transmitter. The description below assumes that transmitter 250pa is the selected transmitter. Within the transmitter 250pa, the transmit circuit 252pa may amplify, filter, and up-convert the analog output signal from baseband to RF and provide a modulated RF signal. The transmit circuit 252pa may include amplifiers, filters, mixers, matching circuits, an oscillator, an LO generator, a PLL, and other suitable components or circuits. A PA 254pa receives and amplifies the modulated RF signal and provides a transmit RF signal having the proper output power level. The transmit RF signal is routed through antenna interface circuit 224 and transmitted via primary antenna 210. Each remaining transmitter 250 in the transceivers 220 and 222 may operate in similar manner as the transmitter 250pa. In a similar manner, secondary antenna interface circuit 226 may route RF signals between secondary antenna 212 and secondary LNA module 240s and/or secondary power amplifier module 254s.

Each receiver 230 and transmitter 250 may also include other circuits not shown in FIG. 2, such as filters, matching circuits, and/or other suitable components or circuits. All or a portion of the transceivers 220 and 222 may be implemented on one or more analog integrated circuits (ICs), RF ICs (RFICs), mixed-signal ICs, and other suitable ICs. For example, the LNAs 240 and the receive circuits 242 within the transceivers 220 and 222 may be implemented on multiple IC chips. The circuits in the transceivers 220 and 222 may also be implemented in other manners.

The data processor/controller 280 may perform various functions for the wireless device 110. For example, the data processor/controller 280 may perform processing for data being received via the receivers 230 and data being transmitted via the transmitters 250. The data processor/controller 280 may control the operations of the various circuits within the transceivers 220 and 222. A memory 282 may store program codes and data for the data processor/controller 280. The data processor/controller 280 may be implemented on one or more application specific integrated circuits (ASICs) and/or other ICs.

FIG. 3 is a band diagram 300 depicting three example frequency bands 312, 314, and 316 that may be of interest to wireless device 110. Frequency band 312 (which may also be referred to as the Unlicensed National Information Infrastructure (U-NII) radio band), which is depicted in FIG. 3 as ranging from approximately 5.1 GHz to 5.9 GHz, may include LTE-U cellular signals transmitted from and/or received by wireless device 110, and may include 5G Wi-Fi signals (e.g., as defined in the IEEE 802.11ac standards) transmitted from and/or received by wireless device 110. For example, channel 36 of the 5G Wi-Fi frequency band has a center frequency of approximately 5.18 GHz, and channel 165 of the 5G Wi-Fi frequency band has a center frequency of approximately 5.825 GHz.

Frequency band 314, which is depicted in FIG. 3 as ranging from approximately 700 MHz to 2.6 GHz, may include LTE-L cellular signals transmitted from and/or received by wireless device 110 and/or cellular signals transmitted from base station 130, and may include 2.4G Wi-Fi signals (e.g., as defined in the IEEE 802.11n standards) transmitted from and/or received by wireless device 110. For example, channel 1 of the 2.4G Wi-Fi frequency band has a center frequency of approximately 2.412 GHz, and channel 11 of the 2.4G Wi-Fi frequency band has a center frequency of approximately 2.462 GHz; LTE Band 2 of the LTE-L frequency band ranges from 1.85 GHz to 1.91 GHz and has third order harmonics ranging from approximately 5.55 GHz to 5.73 GHz, and channel 41 of the LTE-L frequency band has a center frequency of approximately 2.5 GHz has second harmonics ranging from approximately 4.9 GHz to 5.3 GHz. All of these signals may impose a degradation to LTE-U and/or 5G Wi-Fi receiver band SNR.

For example embodiments, wireless device 110 may support dual-band wireless communications (e.g., wireless device 110 may transmit/receive signals in both frequency band 312 and frequency band 314). For example, referring also to FIG. 2, one or more of the transceiver chains of primary transceiver 220 may be configured to transmit/receive 5G Wi-Fi signals and/or LTE-U signals, while one or more of the transceiver chains of secondary transceiver 222 may be configured to transmit/receive 2.4G Wi-Fi signals and/or LTE-L signals. Thus, for this example, it may be desirable for the receivers 230pa-230pk of the primary transceiver 220 to attenuate signals having frequencies in the frequency band 314 so that LTE-L and/or 2.4G Wi-Fi signals transmitted from and/or received by the secondary transceiver 222 do not interfere with the reception of LTE-U and/or 5G Wi-Fi signals by the primary transceiver 220.

Frequency band 316, which is depicted in FIG. 3 as ranging from approximately 10 GHz to 12 GHz (e.g., to cover the second order or higher harmonics of desired frequency band 312 for this example), may contain unwanted blocker images as defined by the 3GPP Technical Specifications. Signals having frequencies within frequency band 316 may also be received and down-converted through receive circuits 242, which may exhibit gain at harmonics of the signals. Thus, it may also be desirable for the primary transceiver 220 and/or the secondary transceiver 220 to attenuate signals having frequencies in the second-order or higher harmonics frequency band 316.

Figure 4A:
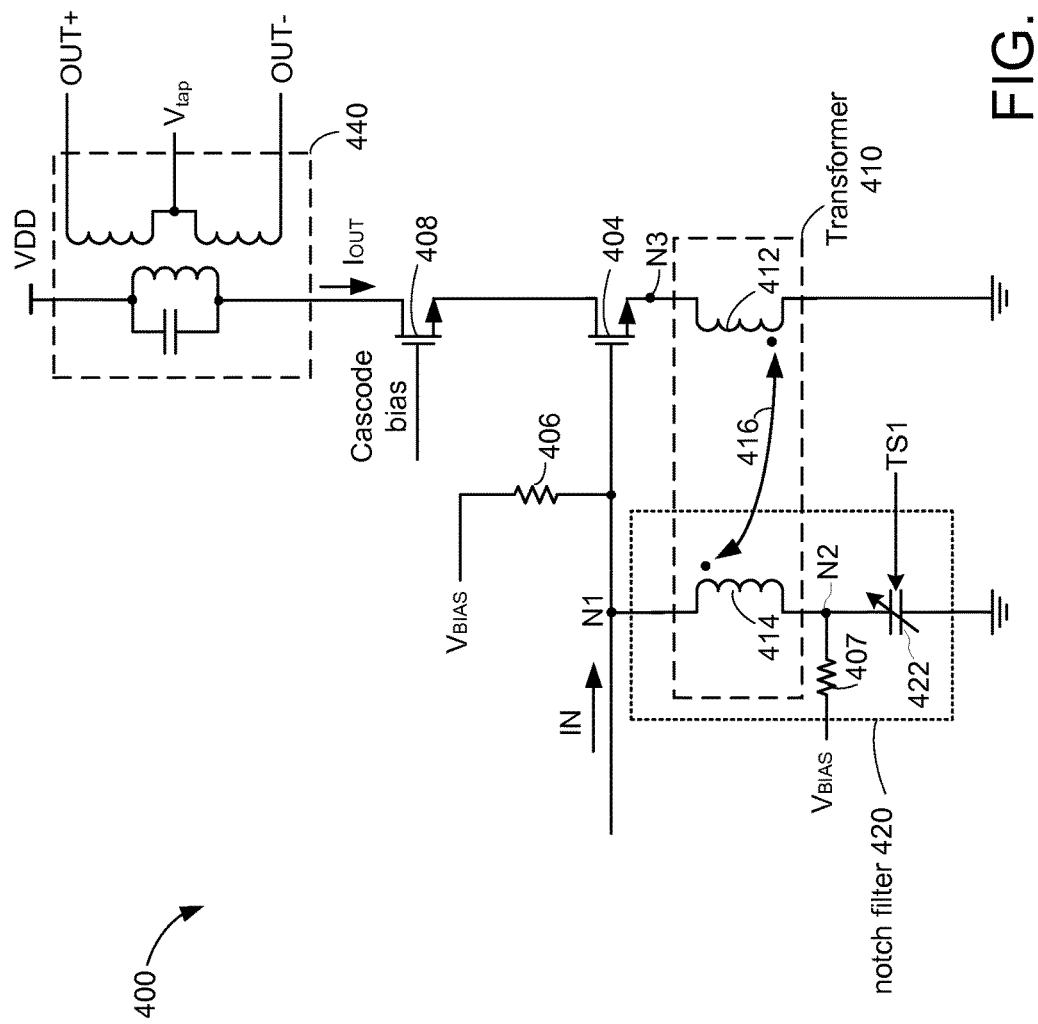
FIG. 4A is a circuit diagram of an amplifier in accordance with some embodiments.

FIG. 4A is a circuit diagram depicting an example LNA 400, in accordance with some embodiments. The LNA 400, which may be one embodiment of one or more of the LNAs 240pa-240pk and/or one or more of the LNAs 240sa-240sl of FIG. 2, may be used to amplify an input signal (IN) to generate a differential output signal OUT (e.g., denoted as OUT+ and OUT− in FIG. 4A). For other embodiments, the LNA 400 may generate a single-ended output signal based on the input signal IN.

The LNA 400 is shown to include an input node N1, a gain transistor 404, a bias resistor 406, a cascode transistor 408, a transformer 410, a notch filter 420, and an output circuit 440. The input signal IN may be received from the primary antenna 210 via one of receivers 230pa-230pk, or may be received from the secondary antenna 212 via one of receivers 230sa-230sl. The input signal IN may be amplified by gain transistor 404 (and cascode transistor 408) to generate an output current ($I_{OUT}$), which in turn may be converted to differential output signal OUT+/OUT− by output circuit 440.

The transformer 410 may be formed by a degeneration inductor 412 and a shunt inductor 414. The notch filter 420 may be formed by shunt inductor 414 and a variable capacitor 422. As described in more detail below, the transformer 410 may provide impedance matching for LNA 400, and the notch filter 420 may attenuate frequencies of the input signal IN that fall within a first frequency range. Further, as described in more detail below, the transformer 410 and the notch filter 420 may share the shunt inductor 414, which may not only reduce circuit area but may also improve performance (e.g., compared with LNAs that provide impedance matching using a transformer that does not share an inductor with notch filter 420).

The gain transistor 404, cascode transistor 408, and degeneration inductor 412 are coupled in series between output circuit 440 and ground potential. More specifically, cascode transistor 408 includes a drain coupled to output circuit 440, a gate to receive a cascode bias voltage, and a source coupled to a drain of gain transistor 404. The cascode bias voltage may be used to set and/or adjust a gain of cascode transistor 408.

Gain transistor 404 includes a gate to receive the input signal IN via input node N1, and a source coupled to a first terminal of degeneration inductor 412 at node N3. A second terminal of degeneration inductor 412 is coupled to ground. Input node N1 may also be coupled to a bias voltage ($V_{BIAS}$) via a resistor 406. The voltage $V_{BIAS}$ may provide a direct current (DC) bias that causes the gain transistor 404 to operate at a desired DC level for maximum gain or signal swings. The bias voltage $V_{BIAS}$ may also be provided to node N2 through a resistor 407, as depicted in FIG. 4A. For other embodiments, the bias voltage $V_{BIAS}$ may not be provided to node N2.

For some embodiments, the gain transistor 404 and/or the cascode transistor 408 may be N-type metal-oxide-semiconductor (NMOS) transistors, as depicted in FIG. 4A. For other embodiments, the gain transistor 404 and/or the cascade transistor 408 may be any suitable type of transistor including (but limited to) PMOS transistors, CMOS transistors, field-effect transistors (FETs), and bipolar transistors.

The output circuit 440 is coupled between a supply voltage (VDD) and the drain of cascade transistor 408, and may generate the differential output signal OUT based on the output current $I_{OUT}$ flowing from VDD to ground through cascode transistor 408 and gain transistor 404. The output circuit 440 is shown to include a center tap coupled to a tap voltage ($V_{tap}$), which may be of any suitable voltage level. Operation of output circuit 440 is well-known in the art, and is therefore not described in detail herein. Although output circuit 440 is depicted in FIG. 4A as a balun (e.g., to convert a single-ended output signal corresponding to the output current $I_{OUT}$ to the differential output signal OUT+/OUT−), for other embodiments, output circuit 440 may be configured as a transformer (e.g., to provide a single-ended output signal for LNA 400). For other embodiments, any suitable output circuit or load may be used.

The shunt inductor 414 and variable capacitor 422 are coupled between input node N1 and ground potential, and may be used to shunt the input signal IN to ground (e.g., by providing an alternating current (AC) path between the input node N1 and ground). As mentioned above, the shunt inductor 414 and variable capacitor 422 (which are coupled to each other at node N2) form notch filter 420, and the notch filter frequency is determined by the total effective inductance ($L_{eff}$) of inductor 414 and the total capacitance ($C_{422}$) of the variable capacitor 422 using the formula below:

$$F_{notch} = \frac{1}{2\pi\sqrt{L_{eff} \cdot C_{422}}}.$$

The total effective inductance ($L_{eff}$) is the effective inductance which includes the intrinsic inductance of inductor 414 and the mutual inductance between inductor 414 and inductor 412.

The formed notch filter 420 may be used to attenuate frequencies of the input signal IN that fall within a first frequency range. The variable capacitor 422 may include a control terminal to receive a first tuning signal (TS1). The first tuning signal TS1 may be used to set and/or adjust a capacitance of variable capacitor 422 to a desired level, which in turn may set and/or adjust the first frequency range of notch filter 420. For other embodiments, variable capacitor 422 may be a fixed capacitor (e.g., having a fixed or predetermined capacitance).

Referring also to FIGS. 2-3, the input signal IN may be a 5G Wi-Fi signal or an LTE-U signal having a frequency within the frequency band 312, and thus it may be desirable for LNA 400 to attenuate signals having frequencies in the LTE-L frequency band 314. Accordingly, for at least some embodiments, the first tuning signal TS1 may be used to configure the notch filter 420 to attenuate frequencies of the input signal IN that fall within the frequency band 312 (e.g., so that the first frequency range associated with notch filter 420 corresponds to the frequency band 312). In this manner, the notch filter 420 may filter or attenuate LTE-L signals and/or 2.4G Wi-Fi signals that are undesirably received at (or otherwise coupled to) input node N1.

As mentioned above, transformer 410 is formed by degeneration inductor 412 and shunt inductor 414, and may provide impedance matching for LNA 400. Because wireless device 110 may be configured for dual-band operation, it is desirable for transformer 410 to provide input impedance matching over a wide range of frequencies. The degeneration inductor 412 and the shunt inductor 414 are electromagnetically coupled to each other (denoted in FIG. 4A as electromagnetic coupling 416) to form the transformer 410. A mutual inductance $M_{1,2}$ of transformer 410 may be based, at least in part, on a distance separating degeneration inductor 412 and the shunt inductor 414.

As mentioned above, electromagnetically coupling the degeneration inductor 412 and the shunt inductor 414 together to form transformer 410 may reduce circuit area, for example, compared with impedance-matching transformers formed by electromagnetically coupling a degeneration inductor with a series input inductor. In addition, because a series input inductor (e.g., an inductor coupled between an input terminal of an LNA and the gate of a gain transistor of the LNA) typically has a relatively low Q factor, the resulting noise factor of the LNA may be relatively high. In contrast, the shunt inductor 414 may have a relatively high Q factor, which in turn may allow transformer 410 to provide input impedance matching over a wide range of frequencies while allowing LNA 400 to exhibit a relatively low noise factor.

Further, sharing the shunt inductor 414 between transformer 410 and notch filter 420 may allow LNA 400 to include both an impedance-matching transformer (e.g., transformer 410) and a low-side notch filter (e.g., notch filter 420). More specifically, if LNA 400 were to include a series input inductor coupled in series between input node N1 and the gate of gain transistor 404 (e.g., as may be common in conventional LNA architectures), then the mutual inductances between the series input inductor and shunt inductor 414 may degrade the ability of notch filter 420 to attenuate signals having frequencies in frequency band 314 of FIG. 3.

Figure 4B:
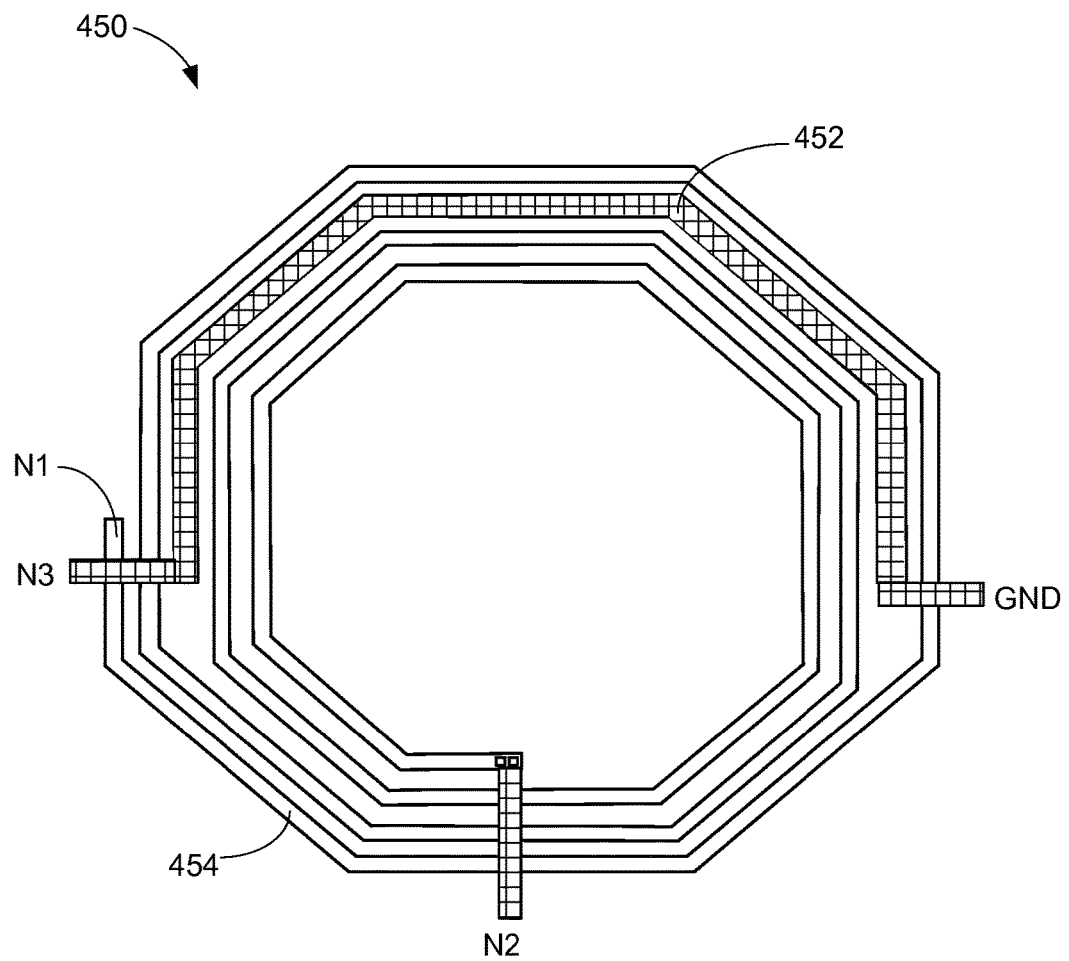
FIG. 4B shows an example layout of the transformer of the amplifier of FIG. 4A, in accordance with some embodiments.

FIG. 4B is a diagram of an example transformer 450 that may be one embodiment of the transformer 410 of LNA 400, in accordance with some embodiments. The transformer 450 may include a first inductor coil 452 (or at least a portion of a coil) and a second inductor coil 454 (or at least a portion of a coil). The first inductor coil 452 may form the degeneration inductor 412 of FIG. 4A, and the second inductor coil 454 may form the shunt inductor 414 of FIG. 4A. The first inductor coil 452 and the second inductor coil 454 may be interleaved, as depicted in FIG. 4B. The mutual inductance between the first inductor coil 452 and the second inductor coil 454, and thus the resonant frequency of transformer 450, may be based at least in part on the separation (e.g., the distance) between the first inductor coil 452 and the second inductor coil 454.

Figure 4C:
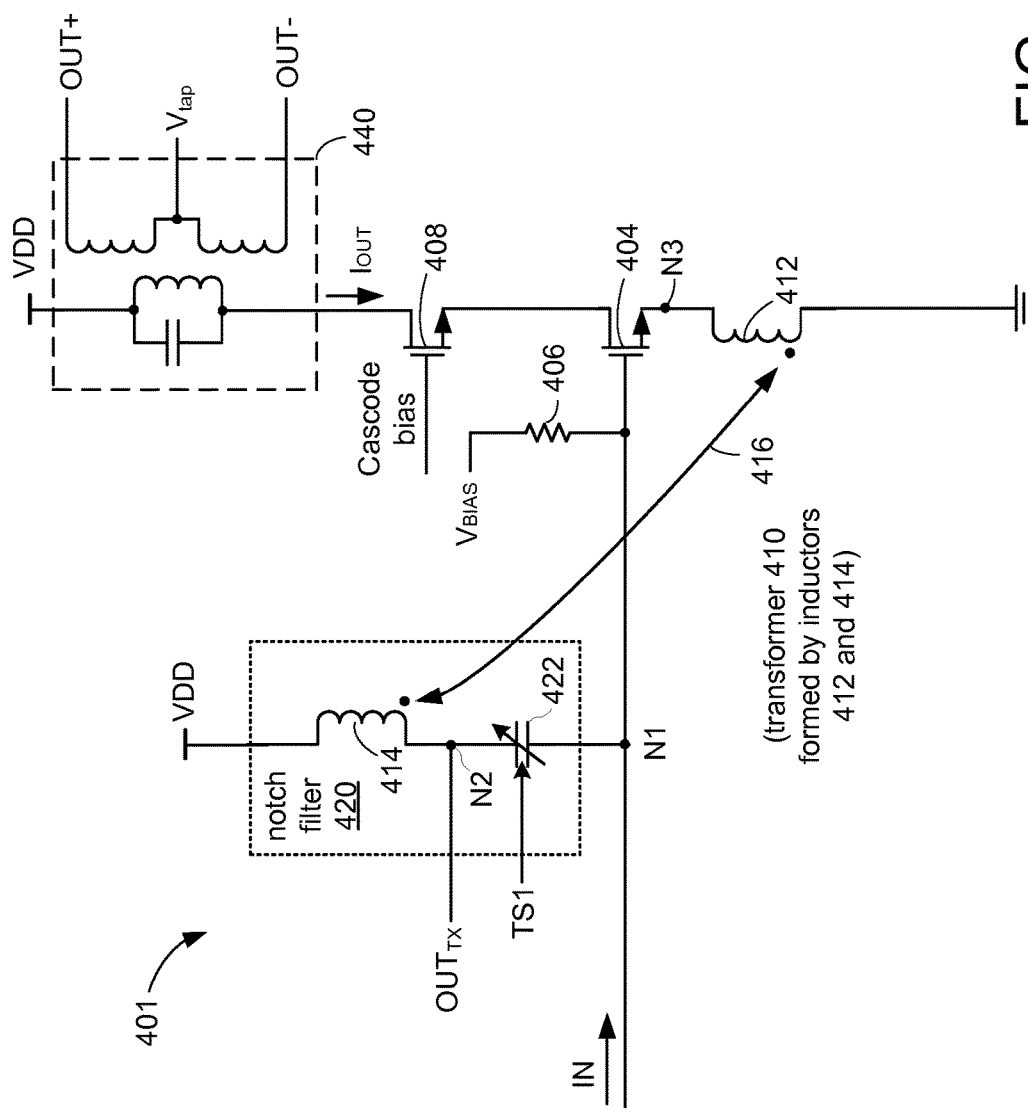
FIG. 4C is a circuit diagram of an amplifier in accordance with other embodiments.

FIG. 4C is a circuit diagram depicting an example LNA 401 in accordance with other embodiments. The LNA 401, which may be one embodiment of one or more of the LNAs 240pa-240pk and/or one or more of the LNAs 240sa-240sl of FIG. 2, is similar to the example LNA 400 of FIG. 4A except that the notch filter 420 is coupled between input node N1 and VDD. More specifically, the shunt inductor 414 and variable capacitor 422 are coupled between VDD and ground potential, and may provide a path from input node N1 to VDD. In addition, a transmit output signal ($OUT_{TX}$) may be provided at node N2 for the example LNA 401 of FIG. 4C.

Figure 5:
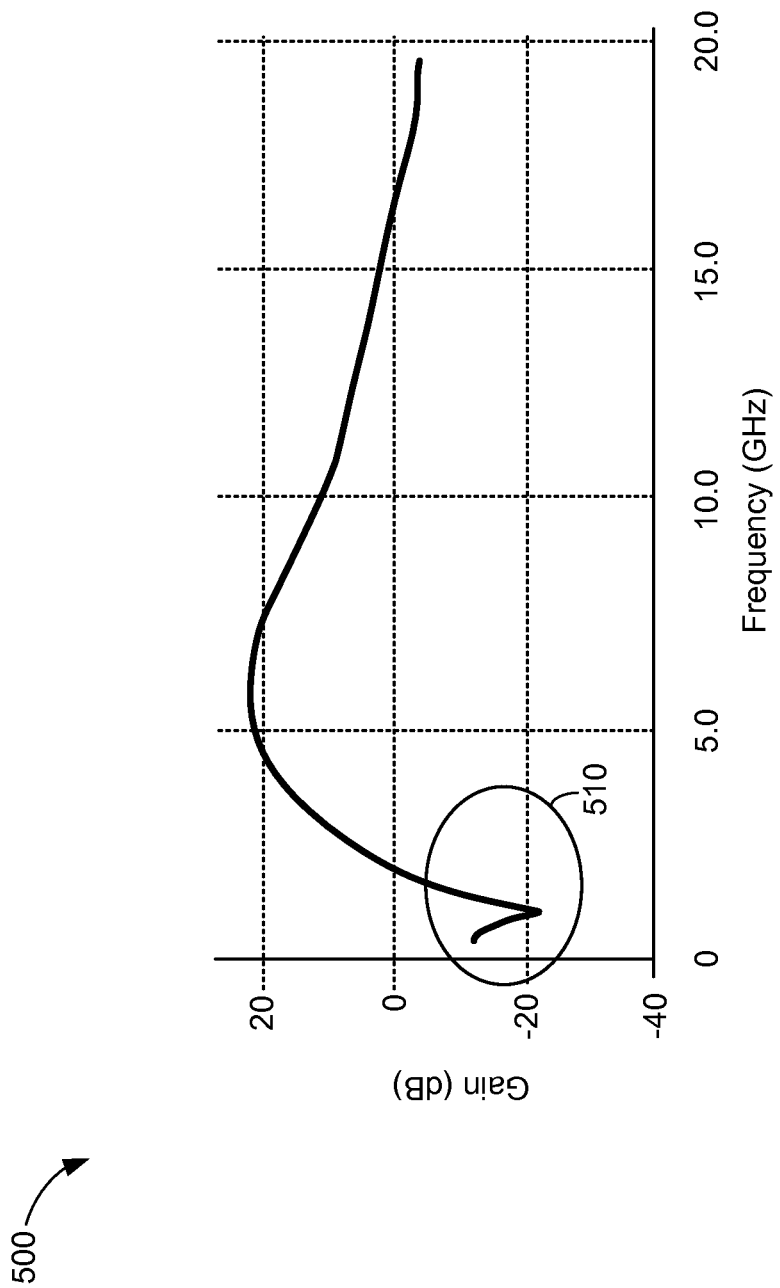
FIG. 5 shows an example frequency response of the amplifier of FIG. 4A.

FIG. 5 shows an example frequency response 500 of the LNA 400 of FIG. 4A. The Y-axis represents the gain of the LNA 400 in decibels (dB), and the X-axis represents frequencies of the input signal (IN) in GHz. As mentioned above, the first tuning signal TS1 may be used to tune the capacitance of variable capacitor 422, for example, to adjust the range of frequencies (e.g., the first frequency range) filtered or attenuated by notch filter 420. For the example frequency response 500 shown in FIG. 5, the capacitance of variable capacitor 422 is tuned such that the notch filter 420 attenuates frequencies of the input signal IN that fall within the LTE-L frequency band 314 (e.g., as denoted by the circled portion 510 of the frequency response 500). Attenuating frequencies of the input signal IN within the LTE-L frequency band 314 may improve the signal to noise ratio of wireless device 110 to receive 5G Wi-Fi signals and LTE-U signals during LTE-L concurrency.

Figure 6:
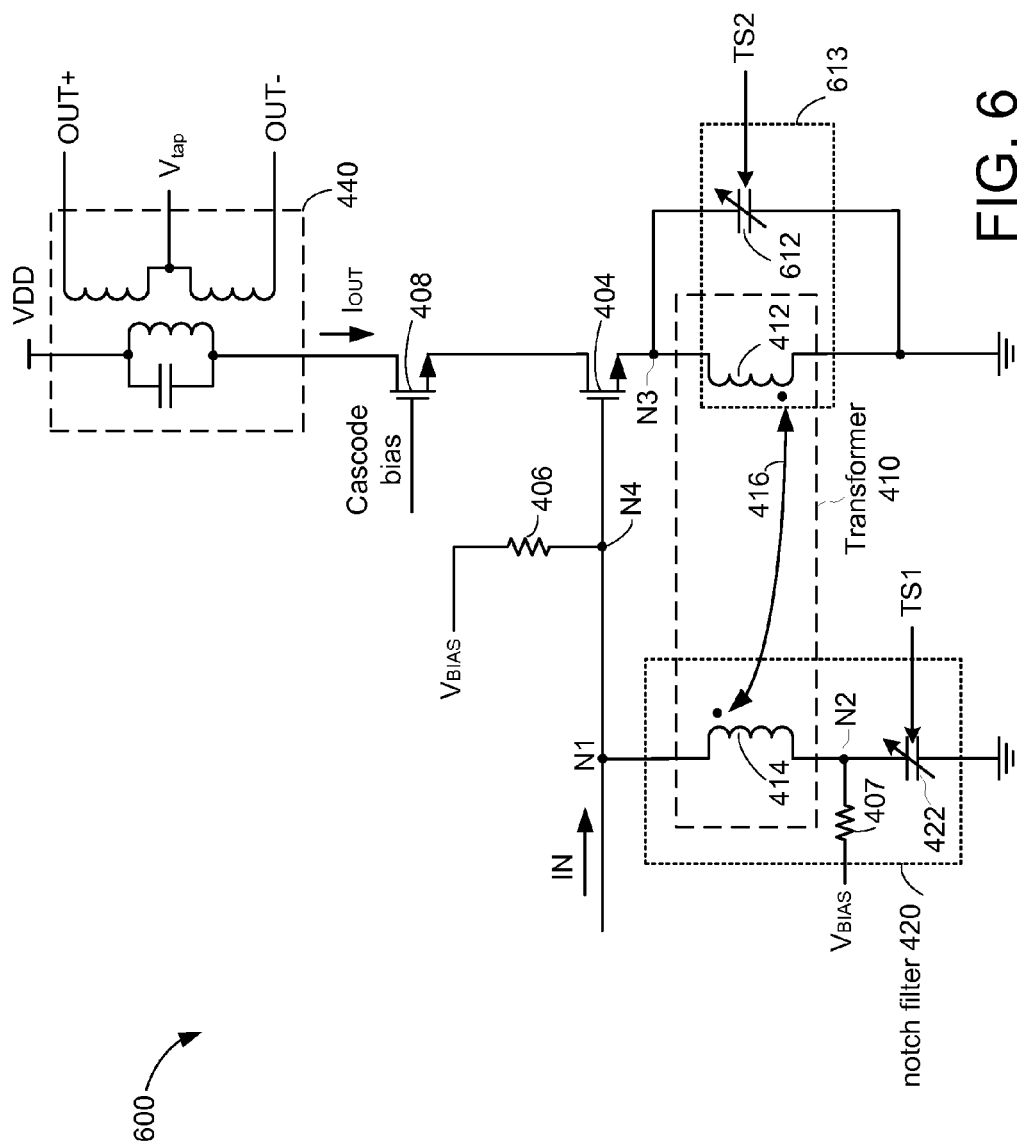
FIG. 6 is a circuit diagram of an amplifier in accordance with other embodiments.

FIG. 6 is a circuit diagram depicting an LNA 600 in accordance with other embodiments. The LNA 600 includes all the components of the LNA 400 of FIG. 4A, plus an additional variable capacitor 612 coupled in parallel with the degeneration inductor 412. The variable capacitor 612 and the degeneration inductor 412 may together form a second filter 613 (e.g., a tank circuit) that attenuates frequencies of the input signal IN that fall within a second frequency range (e.g., that may be different from the first frequency range associated with notch filter 420). The variable capacitor 612 may include a control terminal to receive a second tuning signal (TS2). The second tuning signal TS2 may be used to set and/or adjust a capacitance of variable capacitor 612 to a desired level, which in turn may set and/or adjust the second frequency range associated with the second filter 613.

Referring also to FIG. 3, for at least some embodiments, the second filter 613 may be configured to attenuate relatively high frequencies of the input signal IN (e.g., corresponding to frequencies within the second-order harmonics frequency band 316), and the notch filter 420 may be configured to attenuate relatively low frequencies of the input signal IN (e.g., corresponding to frequencies within the LTE-L frequency band 314). For other embodiments, variable capacitor 612 may be a fixed capacitor (e.g., having a fixed or predetermined capacitance).

Although not shown in the example of FIG. 6, for other embodiments, the LNA 600 may include an input capacitor coupled in series between input node N1 and the gate of gain transistor 404, for example, to provide DC filtering for the input signal IN.

Figure 7:
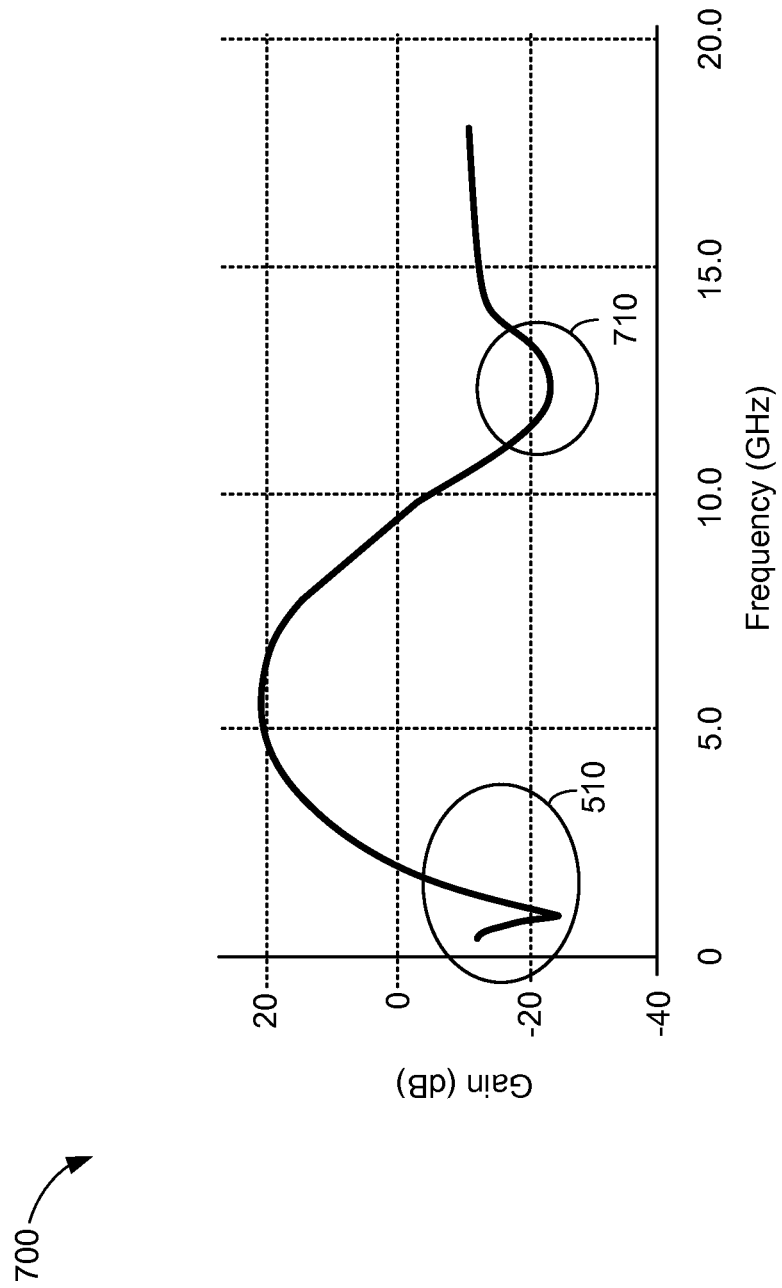
FIG. 7 shows an example frequency response of the amplifier of FIG. 6.

FIG. 7 shows an example frequency response 700 of the LNA 600 of FIG. 6. The Y-axis represents the gain of the LNA 600 in decibels (dB), and the X-axis represents frequencies of the input signal (IN) in GHz. As mentioned above, the first tuning signal TS1 may be used to tune the capacitance of variable capacitor 422, for example, to adjust the range of frequencies (e.g., the first frequency range) filtered or attenuated by notch filter 420, and the second tuning signal TS2 may be used to tune the capacitance of variable capacitor 612, for example, to adjust the range of frequencies (e.g., the second frequency range) filtered or attenuated by second filter 613. For the example frequency response 700 shown in FIG. 7, the capacitance of variable capacitor 422 is tuned such that the notch filter 420 attenuates frequencies of the input signal IN that fall within the LTE-L frequency band 314 (e.g., as denoted by the circled portion 510 of the frequency response 700), and the capacitance of variable capacitor 612 is tuned such that the second filter 613 attenuates frequencies of the input signal IN that fall within the second-order or higher harmonics frequency band 316 (e.g., as denoted by the circled portion 710 of the frequency response 700).

Figure 8A:
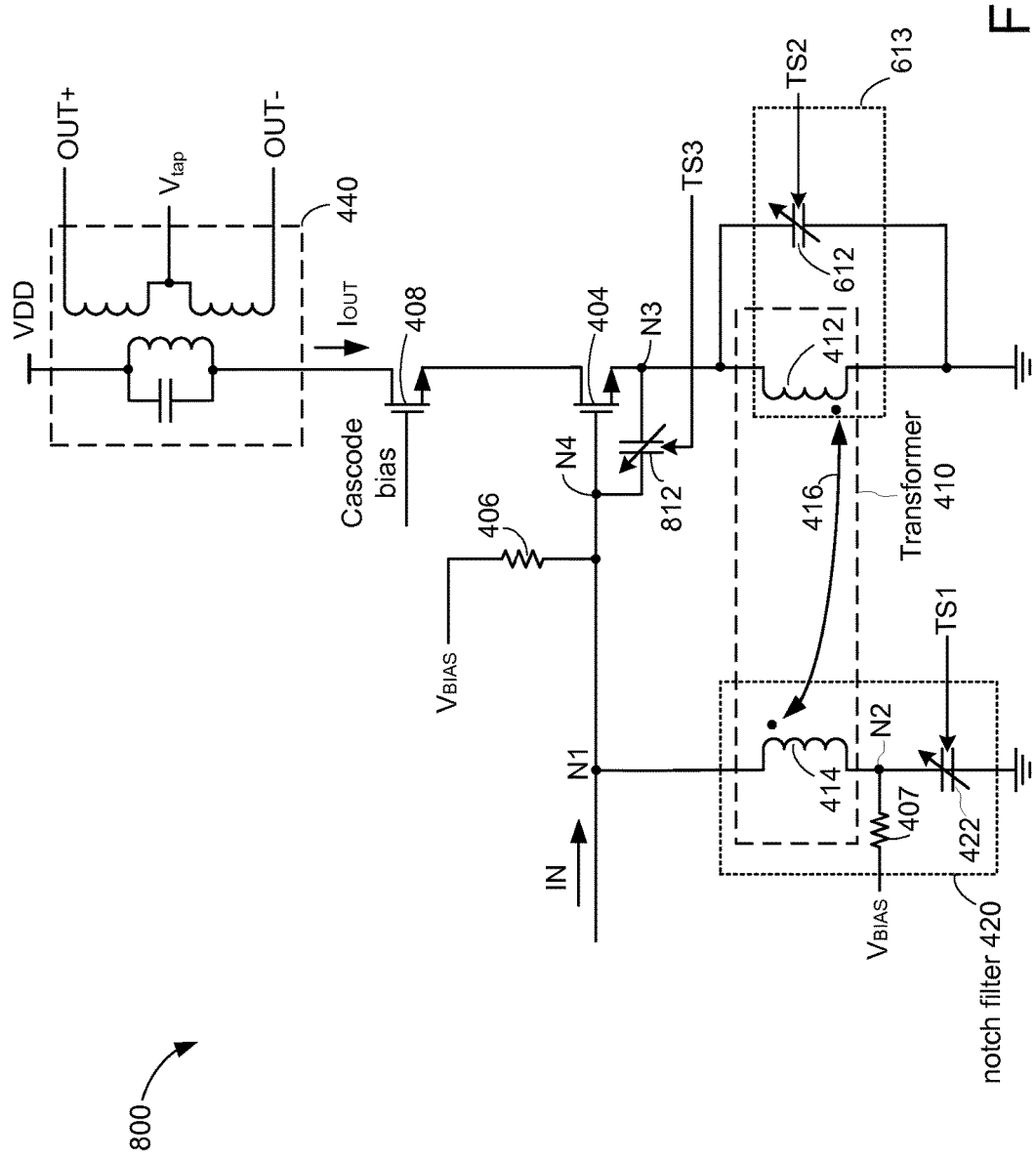
FIG. 8A is a circuit diagram of amplifier in accordance with still other embodiments.

FIG. 8A is a circuit diagram of an LNA 800 in accordance with still other embodiments. The LNA 800 includes all the components of the LNA 600 of FIG. 6, plus an additional variable capacitor 812 coupled between the gate and source of gain transistor 404. The variable capacitor 812 may be used to adjust the inherent gate-source capacitance of the gain transistor 404. More specifically, the variable capacitor 812 may include a control terminal to receive a third tuning signal (TS3) that adjusts a capacitance of variable capacitor 812 to a desired level, which in turn may set and/or adjust a resonant frequency of the LNA 800. For other embodiments, variable capacitor 812 may be a fixed capacitor (e.g., having a fixed or predetermined capacitance).

Figure 8B:
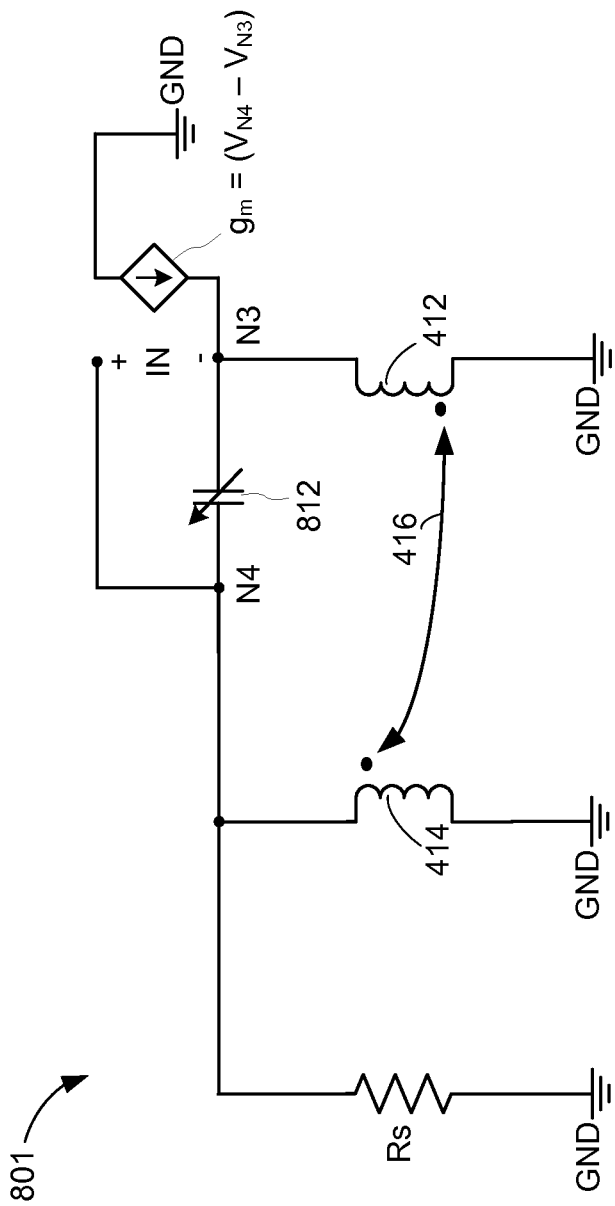
FIG. 8B is a small-signal circuit diagram depicting an equivalent input circuit of the amplifier of FIG. 8A.

FIG. 8B is a small-signal circuit diagram depicting an equivalent input circuit 801 of the LNA 800. The small-signal input circuit 801 is shown to include capacitor 812 coupled in series between the degeneration inductor 412 and the shunt inductor 414, the antenna impedance (Rs), and the transconductance (gm) of gain transistor 404 (e.g., which generates a gm value of $V_{N4}-V_{N3}$). Because the resonant frequency of the LNA 800 of FIG. 8A may be based, at least in part, on the capacitance value of capacitor 812, the resonant frequency of the LNA 800 of FIG. 8A may be adjusted by varying the capacitance of capacitor 812 (e.g., using the third tuning signal TS3). As described above with respect to FIG. 3, the 5G Wi-Fi/LTE-U frequency band 312 may range from approximately 5.15 GHz to 5.925 GHz. Thus, when wireless device 110 is configured to transmit and receive 5G Wi-Fi and/or LTE-U signals, it is desirable to provide impedance matching for input signals having frequencies that may cover approximately 800 MHz. Accordingly, the resonant frequency of the small-signal input circuit 801 may be adjusted to improve impedance matching of the input signal (IN) among various channels within the frequency band 312.

Figure 8C:
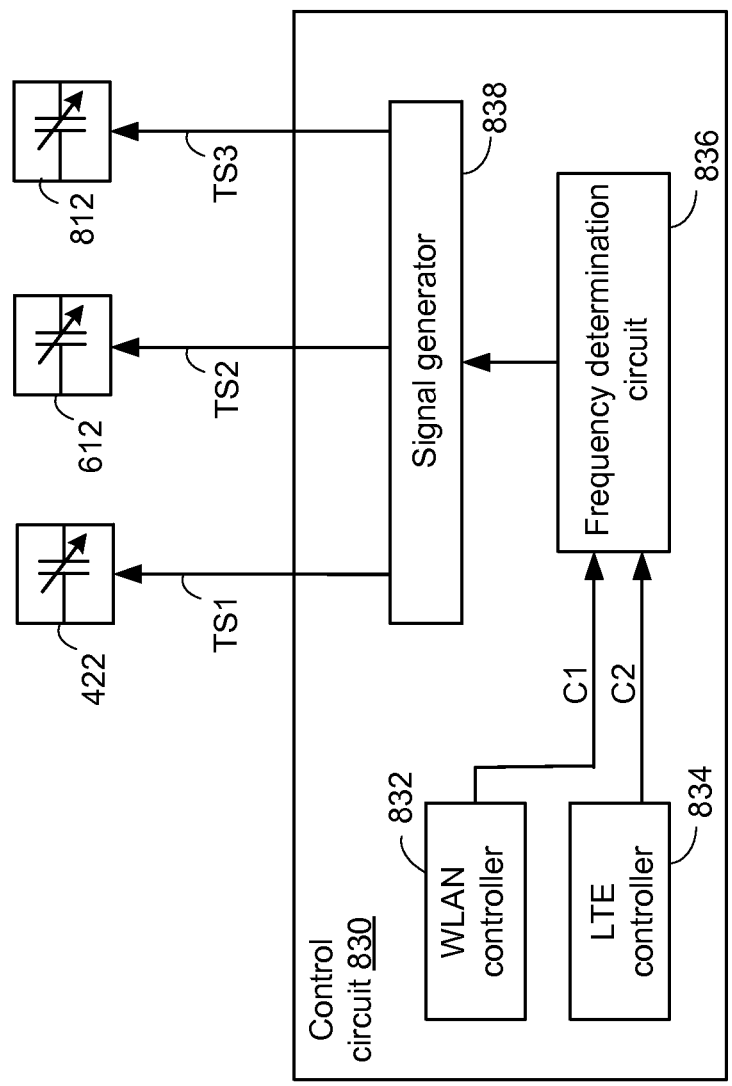
FIG. 8C is a block diagram of a control circuit that may be used to generate tuning signals for one or more of the amplifiers of the example embodiments.

FIG. 8C is a block diagram of a control circuit 830 that may be used to generate the tuning signals TS1-TS3 described above with respect to the LNA 800 of FIG. 8A. For some embodiments, control circuit 830 may be implemented within (or its functions performed by) the data processor/controller 280 of FIG. 2. For other embodiments, control circuit 830 may be implemented as a separate circuit or device. Control circuit 830 is shown to include a WLAN controller 832, an LTE controller 834, a frequency determination circuit 836, and a signal generator 838. The WLAN controller 832, which may be used to control Wi-Fi communications for wireless device 110, may generate a first control signal C1 indicating an operating channel (e.g., a carrier frequency) used by wireless device 110 for Wi-Fi signals. The LTE controller 834, which may be used to control LTE communications for wireless device 110, may generate a second control signal C2 indicating an operating channel (e.g., a carrier frequency) used by wireless device 110 for LTE signals. For at least one embodiment, the WLAN controller 832 may be omitted. For at least another embodiment, the LTE controller 834 may be omitted.

The frequency determination circuit 836 may be used to determine the desired frequency responses of the notch filter 420, the second filter 613, and/or the LCL circuit 801 based, at least in part, on the operating channels used by wireless device 110 for Wi-Fi communications and/or LTE communications (e.g., as indicated by control signals C1-C2).

For example, based on the control signals C1-C2, the frequency determination module 836 may determine that the wireless device 110 is communicating with other devices using cellular signals in LTE-L band 2 and also using 5G Wi-Fi signals. Because LTE-L band 2 has a center frequency of approximately 1.8 GHz, the frequency determination circuit 836 may set the resonant frequency of the notch filter 420 for LNAs associated with receiving the 5G Wi-Fi signals to approximately 1.8 GHz, for example, to attenuate any LTE-L signal components received by (or otherwise coupled into) the LNAs. The frequency determination circuit 836 may also set the resonant frequency of the second filter 613 to attenuate unwanted harmonics of the 5G Wi-Fi signals (e.g., in the second-order harmonics frequency band 316). More specifically, the frequency determination circuit 836 may set the resonant frequency of the second filter 613 to a frequency equal to approximately twice or three-times the frequency of the local oscillator (LO) signals used to down-convert the received 5G Wi-Fi signals. The frequency determination circuit 836 may also set the resonant frequency of the LCL circuit 801 to match the frequency of the received 5G Wi-Fi signals.

The signal generator 838 may generate the tuning signals TS1-TS3 based on the frequency determinations provided by the frequency determination circuit 836. For some embodiments, the signal generator 838 may include a look-up table (or other suitable memory) that stores capacitance values for variable capacitors 422, 612, and 812 based on the frequencies of signals to be received from one or more corresponding receivers and/or on the frequencies of signals to be attenuated. For some implementations, each of the variable capacitors 422, 612, and 812 may include multiple sub-capacitors, each of which gated by a switch, and the tuning signals TS1-TS3 may control the switches to adjust the capacitance values of respective variable capacitors 422, 612, and 812. For other implementations, other suitable structures may be used to form variable capacitors 422, 612, and/or 812.

For other embodiments, the signal generator 838 may be omitted, and the frequency determination circuit 836 may generate the tuning signals TS1-TS3 for variable capacitor 422, variable capacitor 612, and variable capacitor 812, respectively.

Figure 9:
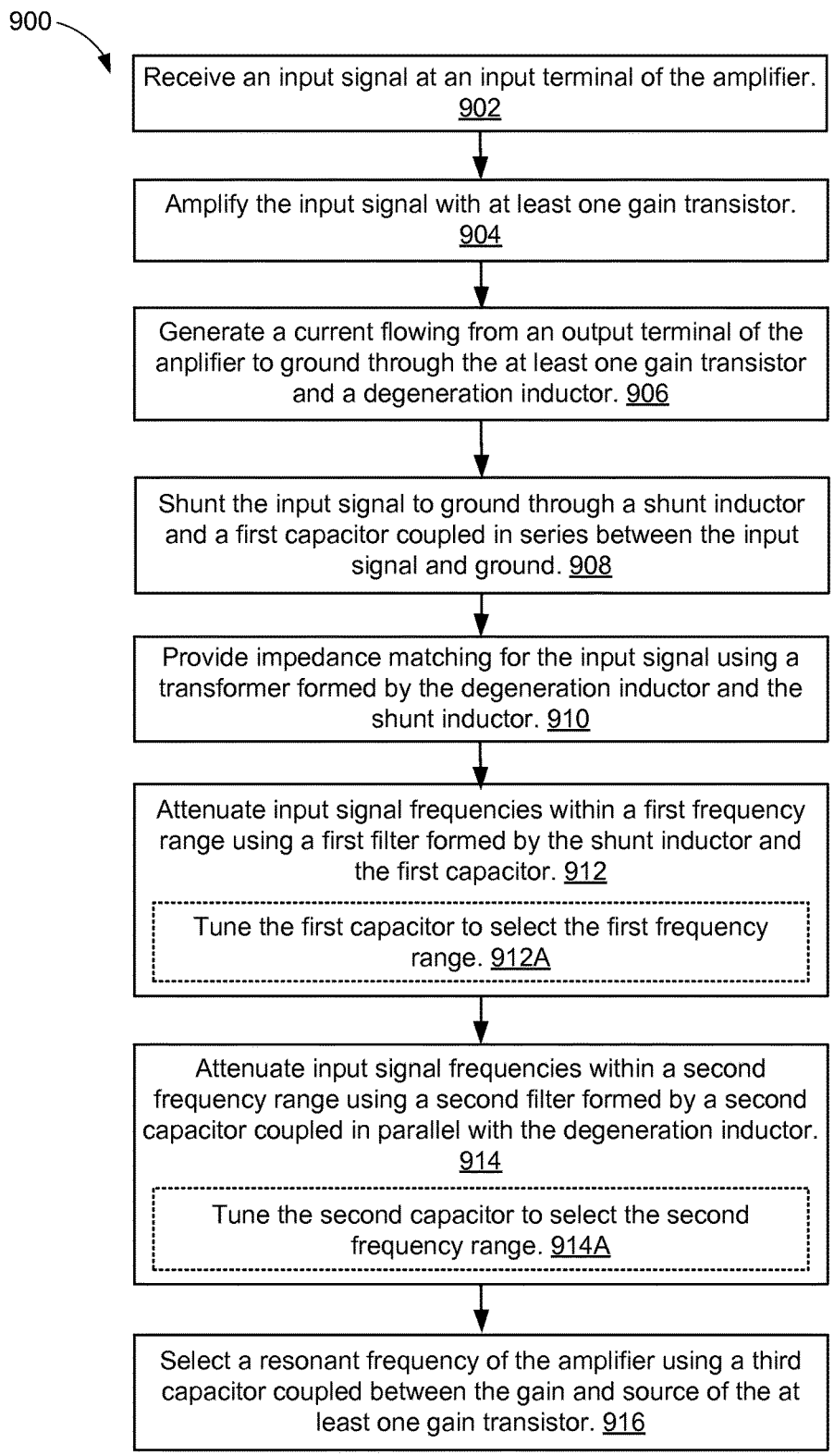
FIG. 9 shows a flowchart depicting an example operation for operating one or more amplifiers of the example embodiments.

FIG. 9 shows a flowchart depicting an example operation 900 for operating one or more of the LNAs in accordance with the example embodiments. For the example operation 900, the example embodiments may perform the operations described therein with additional operations, fewer operations, operations in a different order, operations in parallel, and/or some operations differently. Moreover, a source operation of an arrow may indicate that the target operation of the arrow is a subset of the source operation. Alternately, the arrow may indicate that the target operation is performed subsequent to the source operation or that the target operation is based on or in response to the source operation. These and other relationships among the operations will be understood by persons of ordinary skill in the art in accordance with the descriptions provided with the flowchart.

The example operation 900 may be performed by the wireless device 110 (e.g., as described above with FIGS. 1, 2, 3, 4A-4B, 5-7, and 8A-8C). For purposes of discussion herein, the example operation 900 is described below with respect to the LNA 800 of FIG. 8A. However, the example operation 900 may be performed to operate LNA 400 of FIG. 4A and/or LNA 600 of FIG. 6. First, the wireless device 110 receives an input signal at an input terminal of the LNA 800 (902). As described above, the input signal IN may be received from either primary antenna 210 or secondary antenna 212 of FIG. 2, and the LNA 800 may be one embodiment of LNAs 240pa-240pk or one embodiment of LNAs 240sa-240sl. For example, referring to FIG. 8A, the gain transistor 404 may receive the input signal at its gate.

The input signal IN is amplified with at least one gain transistor 404 of the LNA 800 (904). The LNA 800 generates a current ($I_{OUT}$) flowing from an output terminal of the amplifier to ground through the at least one gain transistor 404 and a degeneration inductor 412 (906). The current ($I_{OUT}$) may represent a single-ended output signal generated in response to the input signal IN. The current ($I_{OUT}$) may be converted to a differential output signal OUT+/OUT− by the output circuit 440.

The LNA 800 may shunt the input signal IN to ground through a shunt inductor 414 and a first capacitor 422 coupled together in series between the input terminal and ground, wherein the degeneration inductor 412 and the shunt inductor 414 form a transformer 410 (908). More specifically, the degeneration inductor 412 and the shunt inductor 414 may be coupled together via electromagnetic induction to form transformer 410. The transformer 410 may be used to provide impedance matching for the input signal (910).

The LNA 800 may attenuate frequencies of the input signal IN within a first frequency range using a first filter formed by the shunt inductor 414 and the first capacitor 422 (912). For example embodiments, the first filter may be the notch filter 420. The LNA 800 may tune the first capacitor 422 (e.g., using first tuning signal TS1) to select the first frequency range (912A). For example implementations in which the LNA 800 is provided within a receiver that receives signals in the 5G Wi-Fi/LTE-U frequency band 312, the first capacitor 422 may be tuned to have a capacitance that aligns the first frequency range with the LTE-L frequency band 314, for example, so that the notch filter 420 filters or attenuates LTE-L signals and/or 2.4G Wi-Fi signals.

The LNA 800 may attenuate frequencies of the input signal IN within a second frequency range using a second filter 613 formed by a second capacitor 612 coupled in parallel with the degeneration inductor 412 (914). The LNA 800 may tune the second capacitor 612 (e.g., using second tuning signal TS2) to select the second frequency range (914A). For example implementations in which the LNA 800 is provided within a receiver that receives signals in the 5G Wi-Fi/LTE-U frequency band 312, the second capacitor 612 may be tuned to have a capacitance that aligns the second frequency range with the second-order harmonics frequency band 316, for example, so that the second filter 613 filters or attenuates second-order harmonics of the 5G Wi-Fi signals and/or LTE-U signals.

The LNA 800 may also select a resonant frequency by tuning a third capacitor 812 coupled between a gate and the source of the at least one gain transistor 404 (916). More specifically, the degeneration inductor 412, the shunt inductor 414, and the third capacitor 812 may form an LCL circuit 801. The resonant frequency of the LCL circuit 801 may be adjusted for input impedance matching using the third tuning signal TS3.

Figure 10:
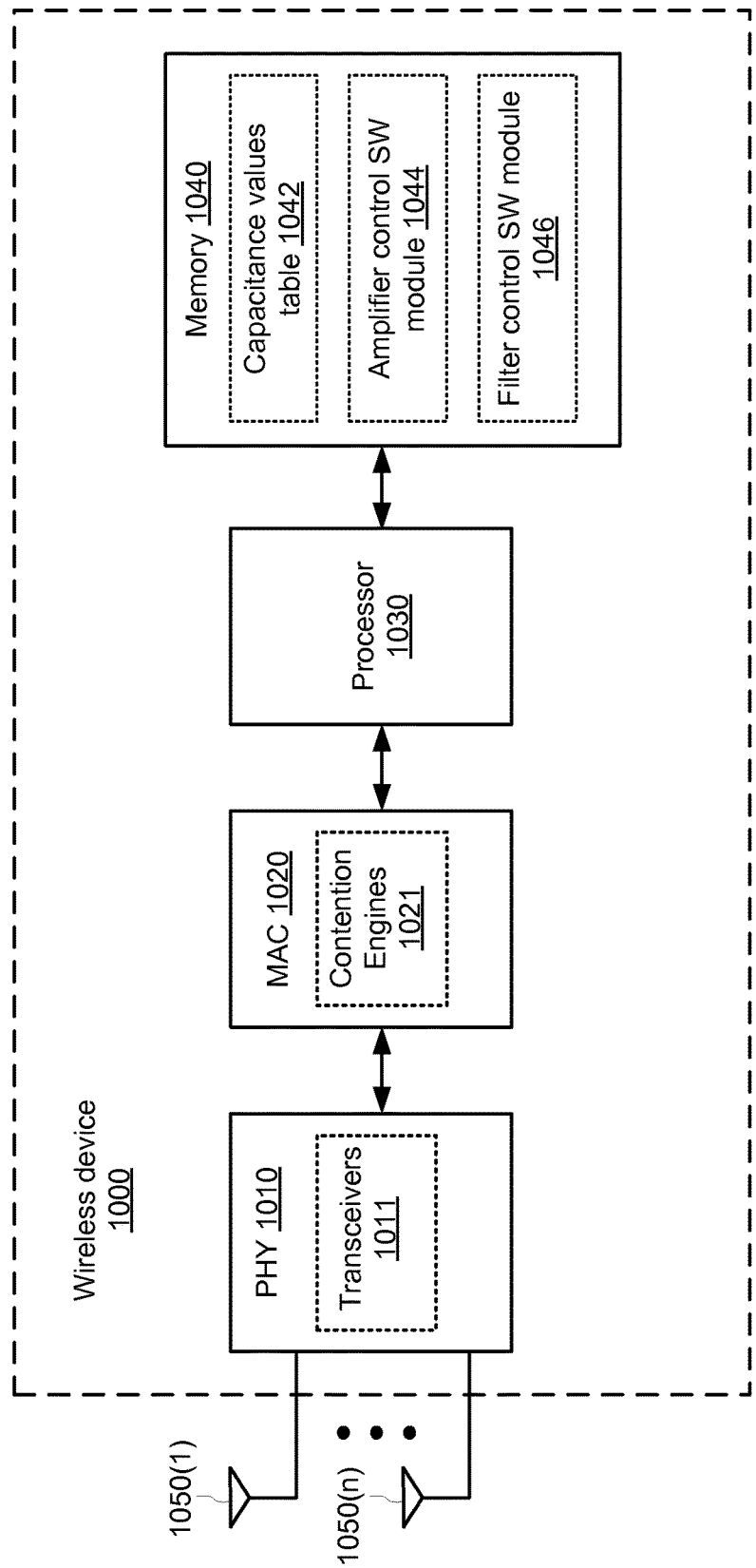
FIG. 10 is a block diagram of wireless device in accordance with example embodiments.

FIG. 10 shows a wireless device 1000 that may be one embodiment of wireless device 110 of FIG. 1. The wireless device 1000 may include a PHY device 1010 including at least a number of transceivers 1011, may include a MAC 1020 including at least a number of contention engines 1021, may include a processor 1030, may include a memory 1040, and may include a number of antennas 1050(1)-1050(n). The transceivers 1011 may be coupled to antennas 1050(1)-1050(n) either directly or through an antenna selection circuit (not shown in FIG. 10 for simplicity). The transceivers 1011 may be used to transmit signals to and receive signals from other wireless devices. Although not shown in FIG. 10 for simplicity, each of the transceivers 1011 may include any number of transmit chains to process and transmit signals to other wireless devices via antennas 1050(1)-1050(n), and may include any number of receive chains to process signals received from antennas 1050(1)-1050(n). Thus, for example embodiments, the wireless device 1000 may be configured for MIMO operations.

For purposes of discussion herein, MAC 1020 is shown in FIG. 10 as being coupled between PHY device 1010 and processor 1030. For actual embodiments, PHY device 1010, MAC 1020, processor 1030, and/or memory 1040 may be connected together using one or more buses (not shown for simplicity).

The contention engines 1021 may contend for access to one more shared wireless mediums, and may also store packets for transmission over the one more shared wireless mediums. The wireless device 1000 may include one or more contention engines 1021 for each of a plurality of different access categories. For other embodiments, the contention engines 1021 may be separate from MAC 1020. For still other embodiments, the contention engines 1021 may be implemented as one or more software modules (e.g., stored in memory 1040 or stored in memory provided within MAC 1020) containing instructions that, when executed by processor 1030, perform the functions of contention engines 1021.

Memory 1040 may include a capacitance values table 1042 that stores capacitance values for variable capacitors 422, 612, and 812 based on the frequencies of signals to be received from one or more corresponding receivers and/or on the frequencies of signals to be attenuated.

Memory 1040 may also include a non-transitory computer-readable medium (e.g., one or more nonvolatile memory elements, such as EPROM, EEPROM, Flash memory, a hard drive, and so on) that may store at least the following software (SW) modules:
  an amplifier control software module 1044 to control various operations of one or more LNAs provided within the transceivers 211 (e.g., as described for operations 902, 904, 906, 908, 910 of FIG. 9); and
  a filter control software module 1046 to select one or more frequency ranges of signals to be filtered or attenuated and/or to select a resonant frequency to provide input signal impedance matching (e.g., as described for operations 912, 914, and 916 of FIG. 9).

Each software module includes instructions that, when executed by processor 1030, cause wireless device 1000 to perform the corresponding functions. The non-transitory computer-readable medium of memory 1040 thus includes instructions for performing all or a portion of the operations depicted in FIG. 9.

Processor 1030, which is shown in the example of FIG. 10 as coupled to PHY device 1010, to MAC 1020, and to memory 1040, may be any suitable one or more processors capable of executing scripts or instructions of one or more software programs stored in wireless device 1000 (e.g., within memory 1040). For example, processor 1030 may execute the amplifier control software module 1044 to control various operations of one or more LNAs provided within the transceivers 211, and may execute the filter control software module 1046 to select one or more frequency ranges of signals to be filtered or attenuated and/or to select a resonant frequency to provide input impedance matching.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A wireless device including a number of transceiver chains, each of the transceiver chains including an amplifier that comprises:
  at least one gain transistor including a first terminal, and including a control terminal to receive an input signal;

a degeneration inductor coupled between the first terminal of the at least one gain transistor and ground; and a shunt inductor and a first capacitor coupled in series between the control terminal of the at least one gain transistor and ground, wherein the degeneration inductor and the shunt inductor form a transformer that is to provide impedance matching for the amplifier.

2. The wireless device of claim 1, wherein the shunt inductor and the first capacitor form a first filter to attenuate frequencies of the input signal within a first frequency range.

3. The wireless device of claim 2, wherein the first capacitor comprises a first variable capacitor having a control terminal to receive a first tuning signal to select the first frequency range.

4. The wireless device of claim 3, further comprising a second capacitor coupled in parallel with the degeneration inductor, wherein the second capacitor and the degeneration inductor form a second filter to attenuate frequencies of the input signal within a second frequency range.

5. The wireless device of claim 4, wherein the second capacitor comprises a second variable capacitor having a control terminal to receive a second tuning signal to select the second frequency range.

6. The wireless device of claim 5, further comprising:
a control circuit to generate the first and second tuning signals based, at least in part, on a frequency of the input signal.

7. The wireless device of claim 6, wherein the control circuit is to generate the first and second tuning signals also based, at least in part, on a frequency of another signal.

8. The wireless device of claim 7, wherein the input signal is associated with a first of the number of transceiver chains, and the other signal is associated with a second of the number of transceiver chains.

9. The wireless device of claim 7, wherein the input signal is a member of the group consisting of a 5G Wi-Fi signal and an LTE-U signal, and the other signal is a member of the group consisting of a 2.4G Wi-Fi signal and an LTE-L signal.

10. The wireless device of claim 5, further comprising a third variable capacitor coupled between the control terminal and the first terminal of the at least one gain transistor, wherein the third variable capacitor is to select a resonant frequency of the amplifier based, at least in part, on a third tuning signal.

11. The wireless device of claim 1, wherein the at least one gain transistor is to receive the input signal without a series input inductor.

12. A method of operating a wireless device including a number of transceiver chains each including an amplifier, the method comprising:
receiving an input signal at an input terminal of the amplifier;
amplifying the input signal with at least one gain transistor;
generating a current flowing from an output terminal of the amplifier to ground through the at least one gain transistor and a degeneration inductor; and
shunting the input signal to ground through a shunt inductor and a first capacitor coupled together in series between the input terminal and ground, wherein the degeneration inductor and the shunt inductor form a transformer.

13. The method of claim 12, further comprising:
providing impedance matching for the input signal using the transformer.

14. The method of claim 12, further comprising:
attenuating frequencies of the input signal within a first frequency range using a first filter formed by the shunt inductor and the first capacitor; and
selecting the first frequency range by tuning the first capacitor with a first tuning signal.

15. The method of claim 14, further comprising:
attenuating frequencies of the input signal within a second frequency range using a second filter formed by a second capacitor coupled in parallel with the degeneration inductor; and
selecting the second frequency range by tuning the second capacitor with a second tuning signal.

16. The method of claim 15, further comprising:
generating the first and second tuning signals based, at least in part, on a frequency of the input signal.

17. The method of claim 16, further comprising:
generating the first and second tuning signals also based, at least in part, on a frequency of another signal.

18. The method of claim 17, wherein the input signal is associated with a first of the number of transceiver chains, and the other signal is associated with a second of the number of transceiver chains.

19. The method of claim 17, wherein the input signal is a member of the group consisting of a 5G Wi-Fi signal and an LTE-U signal, and the other signal is a member of the group consisting of a 2.4G Wi-Fi signal and an LTE-L signal.

20. The method of claim 15, further comprising:
selecting a resonant frequency of the amplifier using a third capacitor coupled between a control terminal and a first terminal of the at least one gain transistor.

21. A non-transitory computer-readable medium storing instructions that, when executed by one or more processors of a wireless device including an amplifier, cause the wireless device to perform operations comprising:
receiving an input signal at an input terminal of the amplifier;
amplifying the input signal with at least one gain transistor;
generating a current flowing from an output terminal of the amplifier to ground through the at least one gain transistor and a degeneration inductor; and
shunting the input signal to ground through a shunt inductor and a first capacitor coupled together in series between the input terminal and ground, wherein the degeneration inductor and the shunt inductor form a transformer.

22. The non-transitory computer-readable medium of claim 21, wherein execution of the instructions causes the wireless device to perform operations further comprising:
providing impedance matching for the input signal using the transformer.

23. The non-transitory computer-readable medium of claim 21, wherein execution of the instructions causes the wireless device to perform operations further comprising:
attenuating frequencies of the input signal within a first frequency range using a first filter formed by the shunt inductor and the first capacitor; and
selecting the first frequency range by tuning the first capacitor with a first tuning signal.

24. The non-transitory computer-readable medium of claim 23, wherein execution of the instructions causes the wireless device to perform operations further comprising:
attenuating frequencies of the input signal within a second frequency range with a second filter formed by a second capacitor coupled in parallel with the degeneration inductor; and selecting the second frequency range by tuning the second capacitor with a second tuning signal.

25. The non-transitory computer-readable medium of claim 24, wherein execution of the instructions causes the wireless device to perform operations further comprising:
generating the first and second tuning signals based, at least in part, on a frequency of the input signal and on a frequency of another signal.

26. The non-transitory computer-readable medium of claim 25, wherein the input signal is a member of the group consisting of a 5G Wi-Fi signal and an LTE-U signal, and the other signal is a member of the group consisting of a 2.4G Wi-Fi signal and an LTE-L signal.

27. An amplifier, comprising:
means for receiving an input signal at an input terminal of the amplifier;
means for amplifying the input signal;
means for generating a current flowing from an output terminal of the amplifier to ground;
means for shunting the input signal to ground; and
means for providing impedance matching for the input signal, wherein:
the means for shunting and the means for providing impedance matching share a shunt inductor coupled between the input terminal and ground, and
the means for providing impedance matching includes a degeneration inductor.

28. The amplifier of claim 27, wherein the means for shunting is to attenuate frequencies of the input signal within a first frequency range.

29. The amplifier of claim 28, further comprising:
means for attenuating frequencies of the input signal within a second frequency range.

30. The amplifier of claim 29, wherein the means for attenuating and the means for impedance matching share the degeneration inductor.

* * * * *